United States Patent
Wadatsumi et al.

(10) Patent No.: US 9,203,601 B2
(45) Date of Patent: Dec. 1, 2015

(54) CDR CIRCUIT AND SERIAL COMMUNICATION INTERFACE CIRCUIT

(71) Applicant: Kabushiki Kaisha Toshiba, Minato-Ku, Tokyo (JP)

(72) Inventors: Junji Wadatsumi, Ota Tokyo (JP); Shouhei Kousai, Yokohama Kanagawa (JP); Daisuke Miyashita, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/465,477

(22) Filed: Aug. 21, 2014

(65) Prior Publication Data

US 2015/0103964 A1   Apr. 16, 2015

(30) Foreign Application Priority Data

Oct. 17, 2013   (JP) .................................. 2013-216721

(51) Int. Cl.
*H04L 7/00* (2006.01)
*H03L 7/00* (2006.01)
*H04L 7/027* (2006.01)

(52) U.S. Cl.
CPC ................ *H04L 7/0037* (2013.01); *H03L 7/00* (2013.01); *H04L 7/0276* (2013.01)

(58) Field of Classification Search
CPC ....................................................... H04B 3/00
USPC ........................................................ 375/371
See application file for complete search history.

(56) References Cited

U.S. PATENT DOCUMENTS

| 5,982,834 A | 11/1999 | Drost et al. | |
| 6,622,256 B1 * | 9/2003 | Dabral et al. | 713/600 |
| 7,302,026 B2 | 11/2007 | Kaeriyama et al. | |
| 8,232,844 B2 | 7/2012 | Maruko | |
| 2008/0266163 A1 * | 10/2008 | Poulton | 341/161 |
| 2010/0127739 A1 * | 5/2010 | Ebuchi et al. | 327/148 |

FOREIGN PATENT DOCUMENTS

| JP | H11-088155 A | 3/1999 |
| JP | 2004-104522 A | 4/2004 |
| JP | 2011-082954 A | 4/2011 |

OTHER PUBLICATIONS

Che-Fu Liang et al., "A 10 Gbps Burst-Mode CDR Circuit in 0.18 mm CMOS", IEEE Custom Intergrated Circuits Conference (CICC), pp. 599-602 (2006).
Che-Fu Liang et al., "A 20/10/5/2. 5Gb/s Power-scaling Burst-Mode CDR Circuit . . . ", Dig. Tech. Papers IEEE Int. Solid State Circuits Conf., U.S.A., 2008 vol. 1, pp. 224-225, (2008).
Kenichi Maruko et al., "A 1.296-to-5.184Gb/s Transceiver with 2.4mW/(Gb/s) Burst-mode CDR . . . ", Dig. Tech. Papers IEEE Int. Solid State Circuits Conf., pp. 364-365, (Feb. 2010).

* cited by examiner

*Primary Examiner* — Lihong Yu
(74) *Attorney, Agent, or Firm* — White & Case LLP

(57) ABSTRACT

The CDR circuit 100 includes first to second data delaying cells ID1, ID2. The CDR circuit 100 includes first to fourth oscillation delaying cells IC1, IC2, IC3, IC4. The CDR circuit 100 outputs a second data signal d2 at a data output terminal TDout as a recovery data signal Dout. The CDR circuit 100 outputs an oscillation clock signal a0 at a clock output terminal TRCK as a recovery clock signal RCK.

18 Claims, 7 Drawing Sheets

| INPUT $a_n$ | CONTROL TERMINAL $c_n$ | OUTPUT $a_{n+1}$ |
|---|---|---|
| H | H | L |
| H | L | H |
| L | H | H |
| L | L | L |

CDR CIRCUIT AND SERIAL COMMUNICATION INTERFACE CIRCUIT

CROSS-REFERENCE TO RELATED APPLICATION

This application is based upon and claims the benefit of priority from the prior Japanese Patent Application No. 2013-216721, filed on Oct. 17, 2013, the entire contents of which are incorporated herein by reference.

BACKGROUND

1. Field

Embodiments described herein relate generally to a CDR circuit and a serial communication interface circuit.

2. Background Art

In digital communication, a CDR circuit reproduces data by making the frequency and phase of a clock signal generated by a receiver coincide with those of a received data stream.

For example, a CDR circuit includes an injection locking oscillator or a gated oscillator. The CDR circuit synchronizes a clock signal and a received signal by directly inputting the received signal to the oscillator in some way.

DETAILED DESCRIPTION

A CDR circuit according to an embodiment includes a first data delaying cell that receives the received data signal, delays the received data signal and outputs a resulting first data signal. The CDR circuit includes a second data delaying cell that receives the first data signal, delays the first data signal and outputs a resulting second data signal. The CDR circuit includes a first oscillation delaying cell that receives an oscillation clock signal, delays the oscillation clock signal and outputs a resulting first clock signal, the first oscillation delaying cell setting a logic of the first clock signal to be the same as a logic of the oscillation clock signal in a case where a logic of the received data signal is a first logic and setting the logic of the first clock signal to be an inversion of the logic of the oscillation clock signal in a case where the logic of the received data signal is a second logic, which is an inversion of the first logic. The CDR circuit includes a second oscillation delaying cell that receives the first clock signal, delays the first clock signal and outputs a resulting second clock signal, the second oscillation delaying cell setting a logic of the second clock signal to be the same as the logic of the first clock signal in a case where a logic of the first data signal is the second logic and setting the logic of the second clock signal to be an inversion of the logic of the first clock signal in a case where the logic of the first data signal is the first logic. The CDR circuit includes a third oscillation delaying cell that receives the second clock signal, delays the second clock signal and outputs a resulting third clock signal. The CDR circuit includes a fourth oscillation delaying cell that receives the third clock signal, delays and inverts a logic of the third clock signal, and outputs a resulting fourth clock signal as the oscillation clock signal.

The CDR circuit outputs the second data signal at a data output terminal as the recovery data signal.

The CDR circuit outputs the oscillation clock signal at a clock output terminal as the recovery clock signal.

In the following, embodiments will be described with reference to the drawings.

(First Embodiment)

Figure 1:
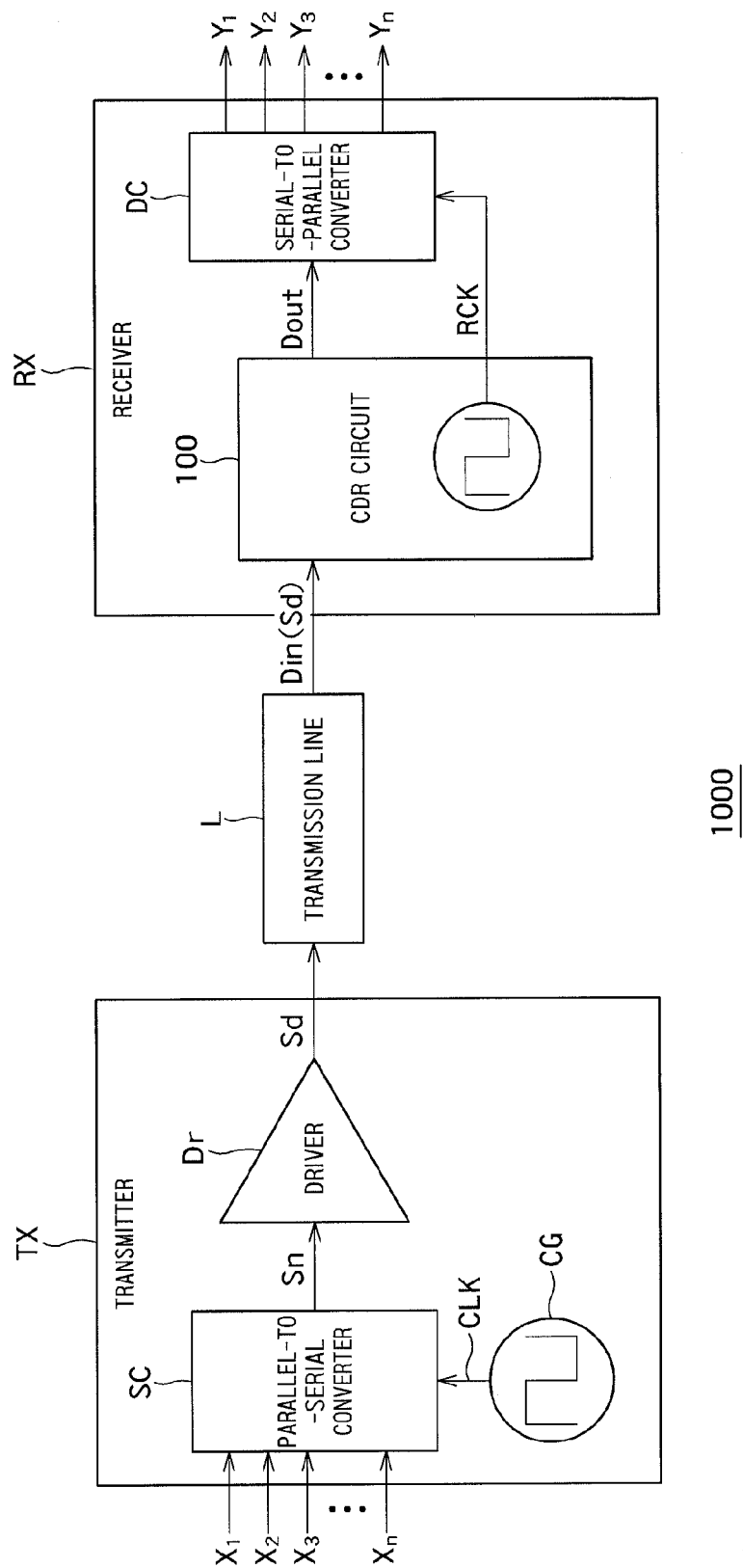
FIG. 1 is a block diagram showing an example of a configuration of a serial communication interface apparatus 1000 according to a first embodiment.

FIG. 1 is a block diagram showing an example of a configuration of a serial communication interface apparatus 1000 according to a first embodiment.

As shown in FIG. 1, the serial communication interface apparatus 1000 includes a transmitter "TX", a transmission line "L" and a receiver "RX".

The transmitter "TX" has a clock generator "CG", a parallel-to-serial converting circuit (serializer) "SC" and a driver "Dr".

The clock generator "CG" generates a clock signal "CLK".

The parallel-to-serial converting circuit "SC" converts n bits of parallel signals "$X_1$", "$X_2$", . . . and "$X_n$" into a serial signal "Sn" in synchronization with the clock signal "CLK".

The driver "Dr" outputs a serial data signal "Sd", which is obtained by converting the serial signal "Sn" to a predetermined signal level prescribed under a communication standard.

The transmission line "L" transmits the serial data signal "Sd" output from the driver "Dr". The transmission line "L" is a pattern, a cable (such as an optical fiber) or the like on a substrate, for example.

The receiver "RX" has a CDR circuit 100 and a serial-to-parallel converting circuit (deserializer) "DC".

The CDR circuit 100 generates a recovery clock signal "RCK" and a recovery data signal "Dout" based on a received data signal "Din", which is the serial data signal "Sd" that is received after being transmitted through the transmission line "L".

The serial-to-parallel converting circuit "DC" uses the recovery clock signal "RCK" to demodulate the recovery data signal "Dout" into n bits of parallel signals "$Y_1$", "$Y_2$", . . . and "$Y_n$". The serial-to-parallel converting circuit "DC" may be included in the CDR circuit 100.

The resulting parallel signals "$X_1$", "$X_2$", . . . and "$X_n$" are input to a digital interface of a next stage.

Figure 2:
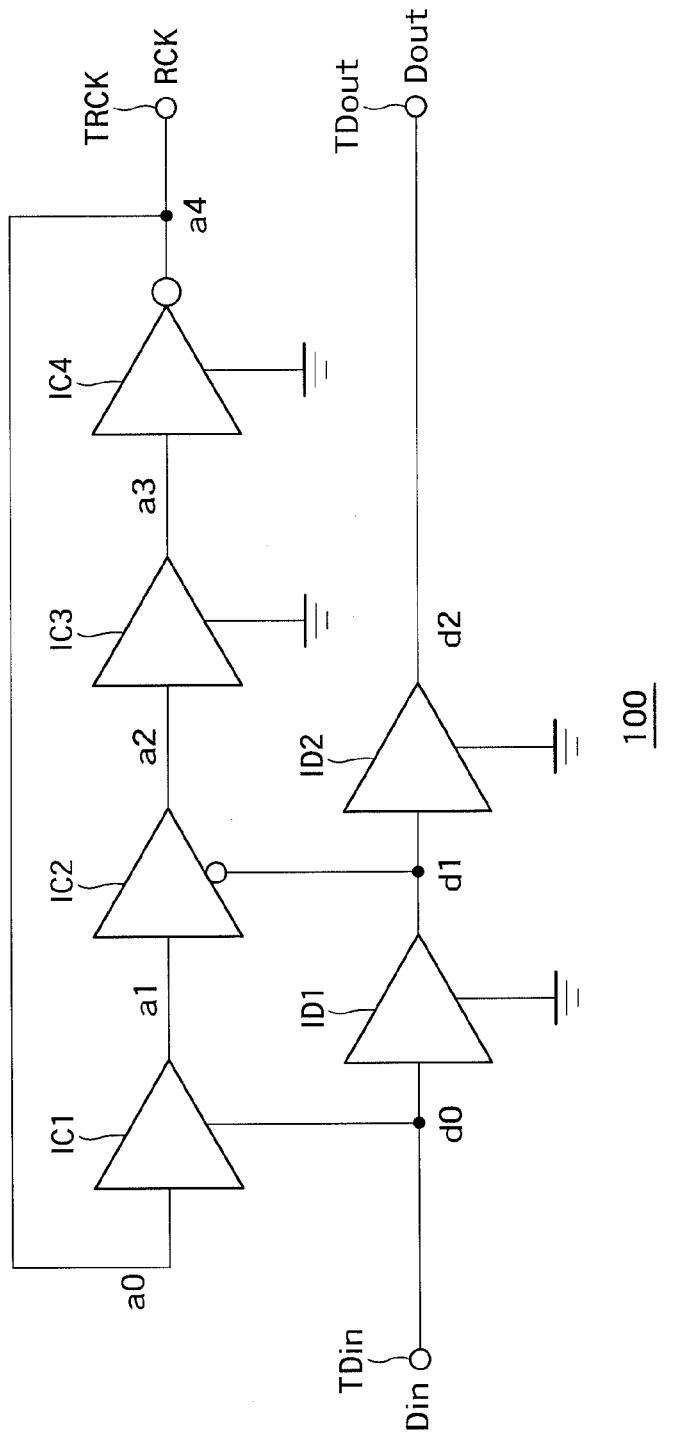
FIG. 2 is a circuit diagram showing an example of a configuration of the CDR circuit 100 according to the first embodiment.

Next, an example of a configuration of the CDR circuit 100 incorporated in the serial communication interface apparatus 1000 shown in FIG. 1 will be described. FIG. 2 is a circuit diagram showing an example of a configuration of the CDR circuit 100 according to the first embodiment.

As shown in FIG. 2, the CDR circuit 100 includes a data input terminal "TDin", a clock output terminal "TRCK", a data output terminal "TDout", a first data delaying cell "ID1", a second data delaying cell "ID2", a first oscillation delaying cell "IC1", a second oscillation delaying cell "IC2", a third oscillation delaying cell "IC3" and a fourth oscillation delaying cell "IC4".

The CDR circuit 100 receives the received data signal "Din" ("d0") at the data input terminal "TDin", generates the recovery clock signal "RCK" and the recovery data signal "Dout" based on the received data signal "Din", and outputs the recovery clock signal "RCK" and the recovery data signal "Dout" at the clock output terminal "TRCK" and the data output terminal "TDout", respectively.

The first data delaying cell "ID1" receives the received data signal "Din" at the data input terminal "TDin", delays the received data signal "Din", and outputs a resulting first data signal "d1".

The second data delaying cell "ID2" receives the first data signal "d1", delays the first data signal "d1" and outputs a resulting second data signal "d2".

The first oscillation delaying cell "IC1" receives an oscillation clock signal "a0", delays the oscillation clock signal "a0" and outputs a resulting first clock signal "a1".

In a case where the logic of the received data signal "Din" is a first logic (a logic "0", a "Low" level, for example), the first oscillation delaying cell "IC1" sets the logic of the first clock signal "a1" to be the same as the logic of the oscillation clock signal "a0".

On the other hand, in a case where the logic of the received data signal "Din" is a second logic (a logic "1", a "High" level, for example), which is an inversion of the first logic, the first oscillation delaying cell "IC1" sets the logic of the first clock signal "a1" to be an inversion of the logic of the oscillation clock signal "a0".

The second oscillation delaying cell "IC2" receives the first clock signal "a1", delays the first clock signal "a1" and outputs a resulting second clock signal "a2".

In a case where the logic of the first data signal "d1" is the second logic described above, the second oscillation delaying cell "IC2" sets the logic of the second clock signal "a2" to be the same as the logic of the first clock signal "a1".

On the other hand, in a case where the logic of the first data signal "d1" is the first logic described above, the second oscillation delaying cell "IC2" sets the logic of the second clock signal "a2" to be an inversion of the logic of the first clock signal "a1".

The third oscillation delaying cell "IC3" receives the second clock signal "a2", delays the second clock signal "a2" and outputs a resulting third clock signal "a3".

The fourth oscillation delaying cell "IC4" receives the third clock signal "a3", delays and inverts the logic of the third clock signal "a3", and outputs a resulting fourth clock signal "a4" as the oscillation clock signal "a0".

In a case where the received data signal "Din" is not input to the CDR circuit 100 (that is, the logic of the received data signal "d0" is fixed at the first logic, and the logic of an inversion of the first data signal "d1" is fixed at the first logic), the first to fourth oscillation delaying cells "IC1" to "IC4" serves as a ring oscillator.

The CDR circuit 100 outputs the second data signal "d2" as the recovery data signal "Dout" at the data output terminal "TDout". In addition, the CDR circuit 100 outputs the oscillation clock signal "a0" (the fourth clock signal "a4") as the recovery clock signal "RCK" at the clock output terminal "TRCK".

The first and second data delaying cells "ID1" and "ID2" and the first to fourth oscillation delaying cells "IC1", "IC2", "IC3" and "IC4" are set to have an equal signal delay time, for example.

This ensures that the recovery data signal and the recovery clock signal are controlled to be in a predetermined phase relationship as described later.

The first and second data delaying cells "ID1" and "ID2" and the first to fourth oscillation delaying cells "IC1", "IC2", "IC3" and "IC4" have the same circuit configuration. More preferably, the first and second data delaying cells "ID1" and "ID2" and the first to fourth oscillation delaying cells "IC1", "IC2", "IC3" and "IC4" are analog multipliers. For example, these delaying cells are Gilbert cell circuits.

This ensures that variations of the delay time among the delaying cells due to the circuit configuration can be reduced.

The first and second data delaying cells "ID1" and "ID2" and the first to fourth oscillation delaying cells "IC1", "IC2", "IC3" and "IC4" are produced in the same manufacturing process, for example.

This ensures that variations of the delay time among the delaying cells due to the manufacturing process can be reduced.

Figures 3, 4:
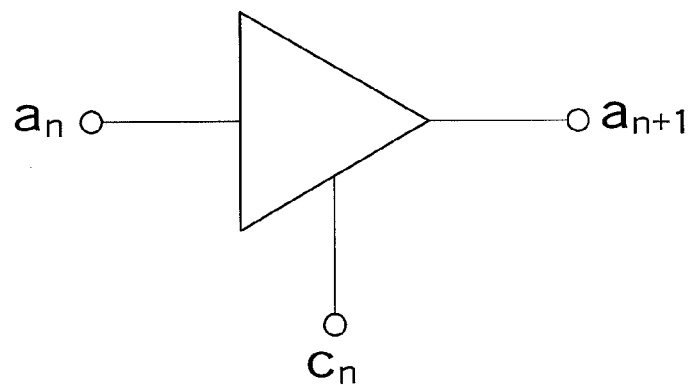
FIG. 3 is a diagram showing an example of a configuration of a delaying cell incorporated in the CDR circuit 100.
FIG. 4 is a table showing an example of a relationship between the logic at a control terminal of the delaying cell shown in FIG. 3 and the logics of the input and output.

Next, a delaying cell incorporated in the CDR circuit 100 will be described. FIG. 3 is a diagram showing an example of a configuration of a delaying cell incorporated in the CDR circuit 100. FIG. 4 is a table showing an example of a relationship between the logic at a control terminal of the delaying cell shown in FIG. 3 and the logics of the input and output. In FIG. 4, the first logic described above corresponds to the "High" level of the signal, and the second logic described above corresponds to the "Low" level of the signal.

As shown in FIG. 3, the delaying cell is configured to receive a signal "an", delay the signal "an" and output a resulting signal "an+1". The delaying cell controls the logic of the signal "an+1" in response to a signal "cn" at the control terminal. The delaying cell is a kind of exclusive-OR circuit.

For example, in a case where the delaying cell is the first oscillation delaying cell "IC1", the signal "an" is the oscillation clock signal "a0", the signal "cn" is the received data signal "d0", and the signal "an+1" is the first clock signal "a1".

For example, in a case where the delaying cell is the second oscillation delaying cell "IC2", the signal "an" is the first clock signal "a1", the signal "cn" is an inversion of the first data signal "d1", and the signal "an+1" is the second clock signal "a2".

For example, in a case where the delaying cell is the third oscillation delaying cell "IC3", the signal "an" is the second clock signal "a2", the signal "cn" is a ground voltage (that is, a signal fixed at the "Low" level), and the signal "an+1" is the third clock signal "a3".

For example, in a case where the delaying cell is the fourth oscillation delaying cell "IC4", the signal "an" is the third clock signal "a3", the signal "cn" is the ground voltage, and an inversion of the signal "an+1" is the fourth clock signal "a4".

For example, in a case where the delaying cell is the first data delaying cell "ID1", the signal "an" is the received data signal "d0", the signal "cn" is the ground voltage, and the signal "an+1" is the first data signal "d1".

For example, in a case where the delaying cell is the second data delaying cell "ID2", the signal "an" is the first data signal "d1", the signal "cn" is the ground voltage, and the signal "an+1" is the second data signal "d2".

As shown in FIG. 4, for example, in a case where the signal level (logic) of the signal "cn" at the control terminal is the "Low" level (first logic), the delaying cell sets the signal level (logic) of the signal "an+1" at the same signal level (logic) as the signal "an".

On the other hand, as shown in FIG. 4, for example, in a case where the signal level (logic) of the signal "cn" at the control terminal is the "High" level (second logic), the delaying cell sets the signal level (logic) of the signal "an+1" at the signal level (logic) of an inversion of the signal "an".

Figure 5:
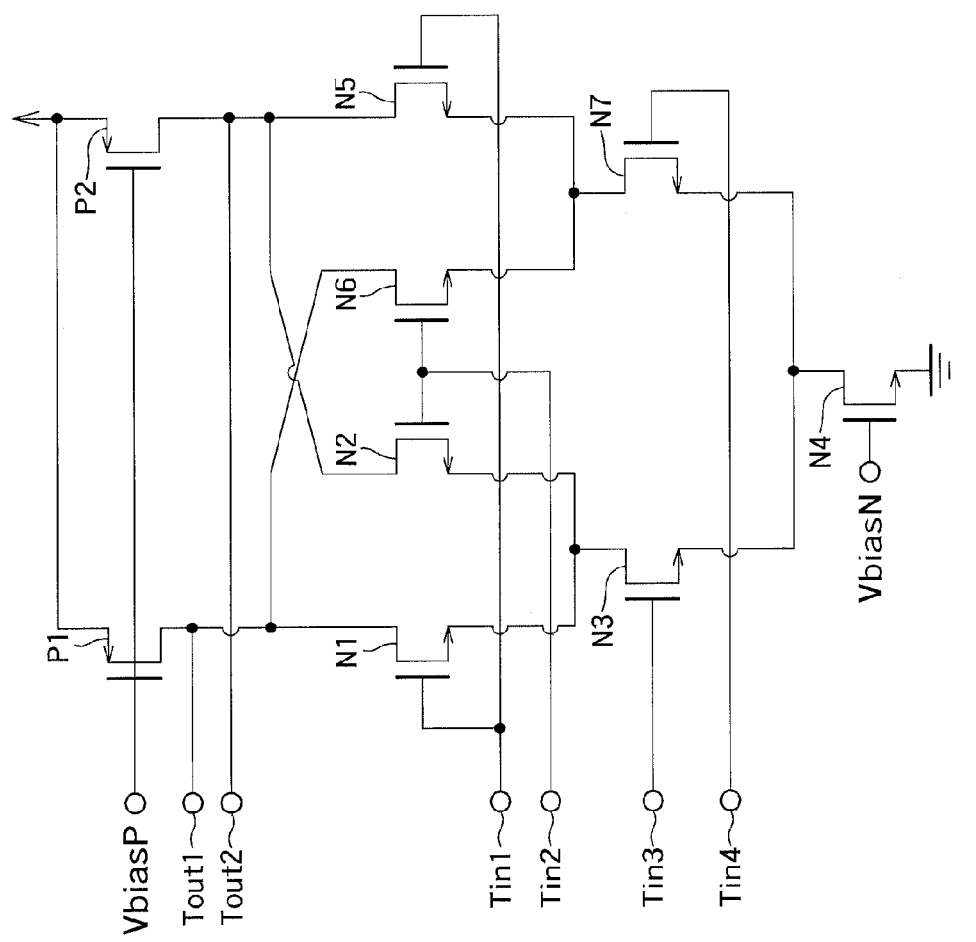
FIG. 5 is a circuit diagram showing an example of a circuit configuration of a Gilbert cell circuit.

Next, an example of a circuit configuration of the Gilbert cell circuit described above will be described. FIG. 5 is a circuit diagram showing an example of a circuit configuration of a Gilbert cell circuit. Referring to FIG. 5, a case where the Gilbert cell circuit is used as the first oscillation delaying cell "IC1" will be described. However, the Gilbert cell circuit can also be used as the other delaying cells.

As shown in FIG. 5, the first oscillation delaying cell "IC1" has a first pMOS transistor "P1", a second pMOS transistor "P2", a first nMOS transistor "N1", a second nMOS transistor "N2", a third nMOS transistor "N3", a fourth nMOS transistor "N4", a fifth nMOS transistor "N5", a sixth nMOS transistor "N6" and a seventh nMOS transistor "N7".

The first pMOS transistor "P1" is connected to a power supply at a source thereof and to an output terminal "Tout1" at a drain thereof. A first voltage "VbiasP" is supplied to a gate of the first pMOS transistor "P1". As a result, a predetermined bias current flows through the first pMOS transistor "P1".

The second pMOS transistor "P2" is connected to the power supply at a source thereof and to a second output terminal "Tout2" at a drain thereof. The first voltage "VbiasP" is supplied to a gate of the second pMOS transistor "P2". As a result, a predetermined bias current flows through the second pMOS transistor "P2".

The first nMOS transistor "N1" is connected to the drain of the first pMOS transistor "P1" at a drain thereof and to a first input terminal "Tin1" at a gate thereof.

The second nMOS transistor "N2" is connected to the drain of the second pMOS transistor "P2" at a drain thereof, to a source of the first nMOS transistor "N1" at a source thereof and to a second input terminal "Tint" at a gate thereof.

The third nMOS transistor "N3" is connected to the source of the first nMOS transistor "N1" at a drain thereof and to a third input terminal "Tin3" at a gate thereof.

The fourth nMOS transistor "N4" is connected to a source of the third nMOS transistor "N3" at a drain thereof and to a ground at a source thereof, and a second voltage "VbiasN" is supplied to a gate of the fourth nMOS transistor "N4". As a result, a predetermined bias current flows through the fourth nMOS transistor "N4".

The fifth nMOS transistor "N5" is connected to the drain of the second pMOS transistor "P2" at a drain thereof and to the first input terminal "Tin1" at a gate thereof.

The sixth nMOS transistor "N6" is connected to the drain of the first pMOS transistor "P1" at a drain thereof, to a source of the fifth nMOS transistor "N5" at a source thereof and to the second input terminal "Tin2" at a gate thereof.

The seventh nMOS transistor "N7" is connected to the source of the fifth MOS transistor "N5" at a drain thereof, to the source of the third nMOS transistor "N3" at a source thereof and to a fourth input terminal "Tin4" at a gate thereof.

For example, in a case where the Gilbert cell circuit shown in FIG. 5 is used as the first oscillation delaying cell "IC1" shown in FIG. 2, one of the oscillation clock signal "a0" and the received data signal "Din" is input to the first input terminal "Tin1" and the second input terminal "Tin2" as differential inputs. Furthermore, the other of the oscillation clock signal "a0" and the received data signal "Din" is input to the third input terminal "Tin3" and the fourth input terminal "Tin4" as differential inputs. In this case, the first oscillation delaying cell "IC1" outputs the first clock signal "a1" at the first output terminal "Tout1" and the second output terminal "Tout2" as differential outputs.

Figure 6:
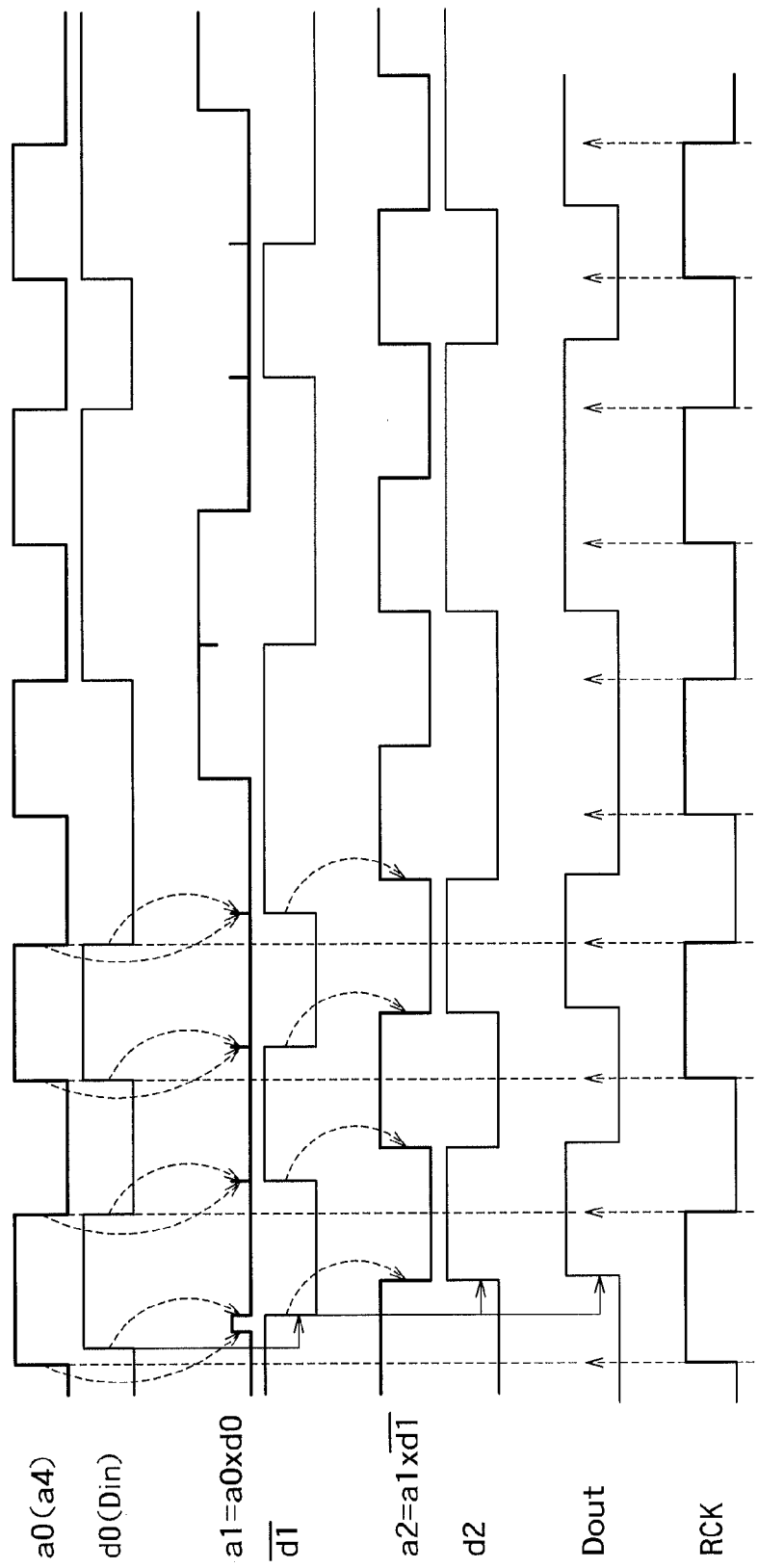
FIG. 6 is a waveform diagram showing an example of signals involved with the CDR circuit 100 shown in FIG. 2.

Next, an example of an operation of the CDR circuit 100 configured as described above will be described. FIG. 6 is a waveform diagram showing an example of signals involved with the CDR circuit 100 shown in FIG. 2.

As described above, when the received data signal "Din" is not input to the CDR circuit 100 in FIG. 2, the first to fourth oscillation delaying cells "IC1" to "IC4" serve as a ring oscillator. In this case, the oscillation clock signal "a0" (which equals to the recovery clock signal "RCK") of the ring oscillator is in an oscillation state.

Supposing that each delaying cell has a delay time of "Td", the recovery clock signal "RCK" oscillates at a frequency of 1/(8Td). It is supposed that the oscillation frequency of the ring oscillator is adjusted to agree with the frequency of the input signal.

As shown in FIG. 6, when the received data signal "Din", which is a serial signal, is input to the CDR circuit 100, whether to invert the first clock signal "a1" or not is determined by the received data signal "Din" ("d0"). Then, the first clock signal "a1" no longer exhibits a periodic waveform.

Then, whether to invert the second clock signal "a2" or not is determined by the inverted signal of the first data signal "d1", and the second clock signal "a2" exhibits a periodic oscillation waveform again as shown in FIG. 6.

Supposing that the delaying cells in the CDR circuit 100 have the same signal delay time, the first clock signal "a1" is generated in synchronization with the first data signal "d1". Therefore, the second data signal "d2" (which equals to the recovery data signal "Dout") and the second clock signal "a2" are in phase with each other.

The fourth clock signal "a4" (oscillation clock signal "a0") output from the ring oscillator described above is the recovery clock signal "RCK". Therefore, the recovery clock signal "RCK" has a waveform that lags behind that of the recovery data signal "Dout" by a quarter of the period, and the center of the H/L data of the recovery data signal "Dout" can be properly sampled.

As described above, the CDR circuit according to this embodiment can control the recovery data signal and the recovery clock signal to be in a predetermined phase relationship.

(Second Embodiment)

In a second embodiment, an example of a CDR circuit having a configuration different from that of the CDR circuit according to the first embodiment will be described.

Figure 7:
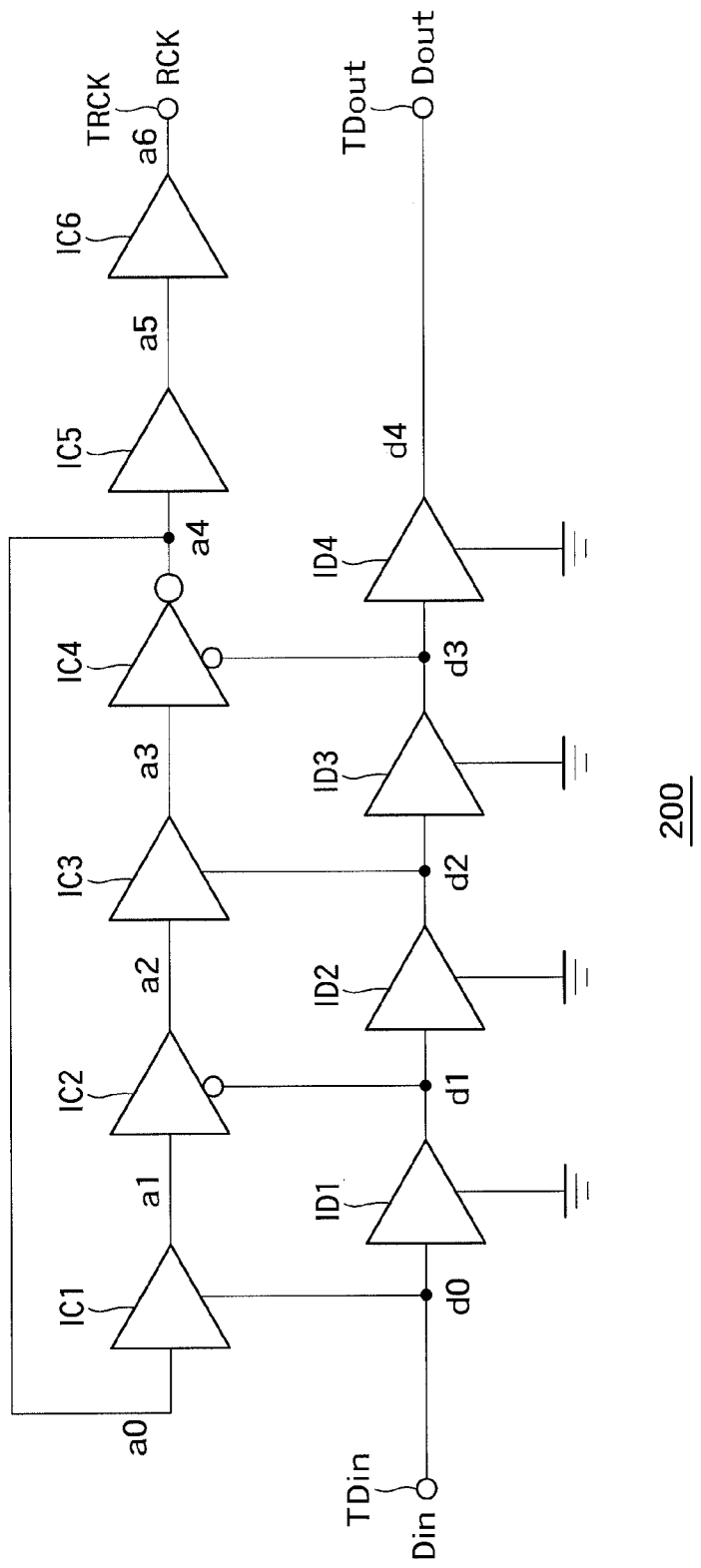
FIG. 7 is a circuit diagram showing an example of a configuration of a CDR circuit 200 according to the second embodiment.

FIG. 7 is a circuit diagram showing an example of a configuration of a CDR circuit 200 according to the second embodiment. Note that the CDR circuit 200 shown in FIG. 7 can be incorporated in the serial communication interface apparatus 1000 shown in FIG. 1, as with the CDR circuit 100 shown in FIG. 2. In FIG. 7, the same reference symbols as those in FIG. 2 denote the same components as those in the first embodiment.

As shown in FIG. 7, the CDR circuit 200 includes the data input terminal "TDin", the clock output terminal "TRCK", the data output terminal "TDout", the first data delaying cell "ID1", the second data delaying cell "ID2", a third data delaying cell "ID3", a fourth data delaying cell "ID4", the first oscillation delaying cell "IC1", the second oscillation delaying cell "IC2", the third oscillation delaying cell "IC3", the fourth oscillation delaying cell "IC4", a fifth oscillation delaying cell "IC5" and a sixth oscillation delaying cell "IC6".

That is, the CDR circuit 200 differs from the CDR circuit 100 shown in FIG. 2 in that the CDR circuit 200 further includes the third data delaying cell "ID3", the fourth data delaying cell "ID4", the fifth oscillation delaying cell "IC5" and the sixth oscillation delaying cell "IC6".

The third data delaying cell "ID3" receives the second data signal "d2", delays the second data signal "d2" and outputs a resulting third data signal "d3".

The fourth data delaying cell "ID4" receives the third data signal "d3", delays the third data signal "d3" and outputs a resulting fourth data signal "d4".

The third oscillation delaying cell "IC3" receives the second clock signal "a2", delays the second clock signal "a2" and outputs the resulting third clock signal "a3".

In the second embodiment, in a case where the logic of the second data signal "a2" is the first logic, the third oscillation delaying cell "IC3" sets the logic of the third clock signal "a3" to be the same as the logic of the second clock signal "a2".

On the other hand, in a case where the logic of the second data signal "a2" is the second logic, the third oscillation delaying cell "IC3" sets the logic of the third clock signal "a3" to be the logic of an inversion of the second clock signal "a2".

The fourth oscillation delaying cell "IC4" receives the third clock signal "a3", delays and inverts the logic of the third clock signal "a3" and outputs the resulting fourth clock signal "a4" (oscillation clock signal "a0").

In the second embodiment, in a case where the logic of the third data signal "a3" is the second logic, the fourth oscillation delaying cell "IC4" sets the logic of the fourth clock signal "a4" to be the logic of an inversion of the third clock signal "a3".

On the other hand, in a case where the logic of the third data signal "a3" is the first logic, the fourth oscillation delaying cell "IC4" sets the logic of the fourth clock signal "a4" to be the same as the logic of the third clock signal "a3".

The fifth oscillation delaying cell "IC5" receives the fourth clock signal "a4", delays the fourth clock signal "a4" and outputs a resulting fifth clock signal "a5".

The sixth oscillation delaying cell "IC6" receives the fifth clock signal "a5", delays the fifth clock signal "a5" and outputs a resulting sixth clock signal "a6".

The third data delaying cell "ID3", the fourth data delaying cell "ID4", the fifth oscillation delaying cell "IC5" and the sixth oscillation delaying cell "IC6" operate as buffers in output stages of the recovery data signal "Dout" and the recovery clock signal "RCK". This ensures that all the internal nodes have the same load capacity and can be kept in an appropriate phase relationship.

The CDR circuit 200 outputs the fourth data signal "d4" at the data output terminal "TRCK" as the recovery data signal "RCK".

The CDR circuit 200 outputs the sixth clock signal "a6" at the clock output terminal "TDout" as the recovery clock signal "Dout".

The first to fourth data delaying cells "ID1", "ID2", "ID3" and "ID4" and the first to sixth oscillation delaying cells "IC1", "IC2", "IC3", "IC4", "IC5" and "IC6" are set to have an equal signal delay time.

This ensures that the recovery data signal and the recovery clock signal are controlled to be in a predetermined phase relationship as described later.

The first to fourth data delaying cells "ID1", "ID2", "ID3" and "ID4" and the first to sixth oscillation delaying cells "IC1", "IC2", "IC3", "IC4", "IC5" and "IC6" have the same circuit configuration, for example. More preferably, the first to fourth data delaying cells "ID1", "ID2", "ID3" and "ID4" and the first to sixth oscillation delaying cells "IC1", "IC2", "IC3", "IC4", "IC5" and "IC6" are analog multipliers. For example, these delaying cells are Gilbert cell circuits. The Gilbert cell circuits have the circuit configuration shown in FIG. 5 described above, for example.

This ensures that variations of the delay time among the delaying cells due to the circuit configuration can be reduced.

The first to fourth data delaying cells "ID1", "ID2", "ID3" and "ID4" and the first to sixth oscillation delaying cells "IC1", "IC2", "IC3", "IC4", "IC5" and "IC6" are produced in the same manufacturing process.

This ensures that variations of the delay time among the delaying cells due to the manufacturing process can be reduced.

The remainder of the configuration and functionality of the CDR circuit 200 is the same as that of the CDR circuit 100 according to the first embodiment.

Figure 8:
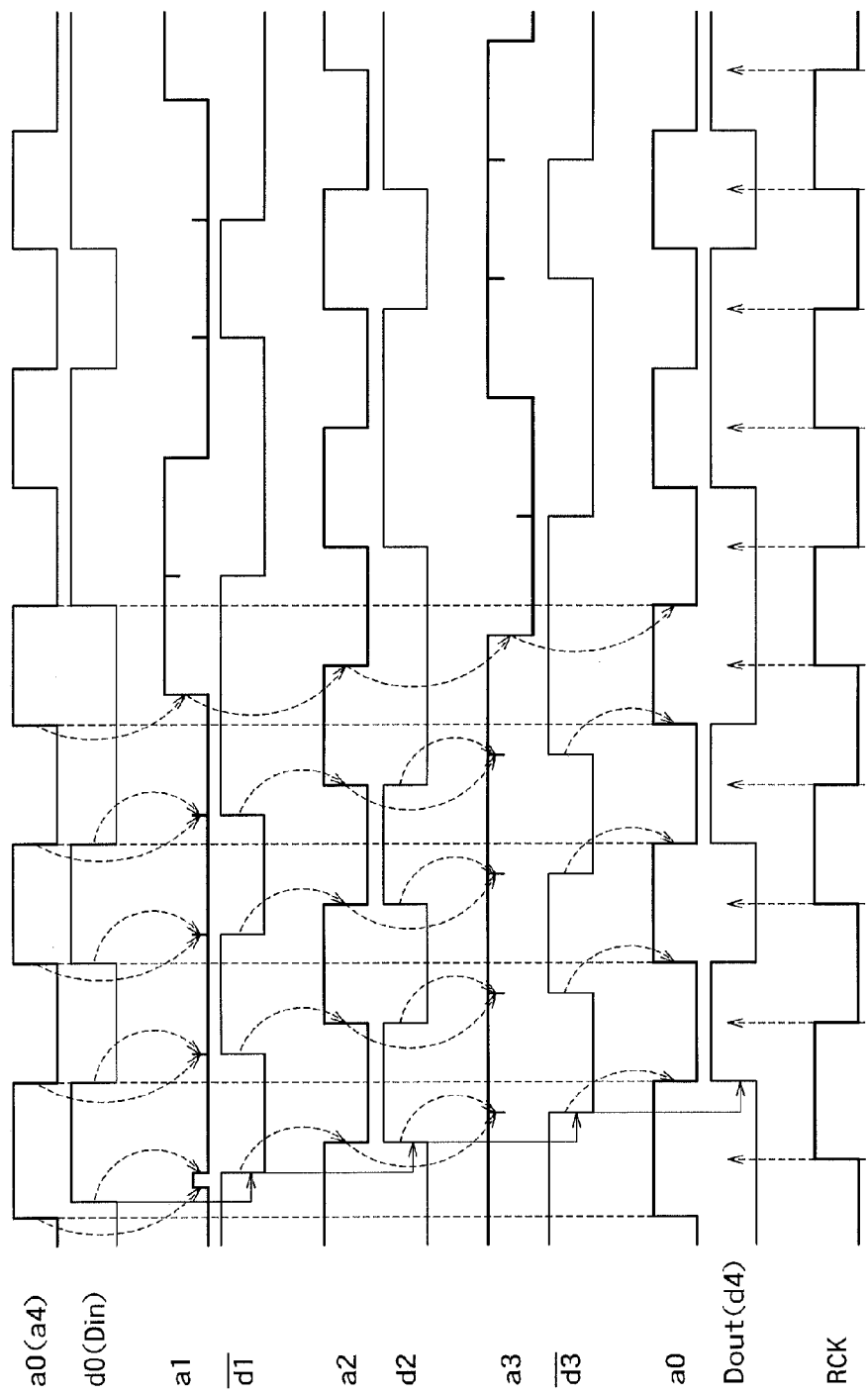
FIG. 8 is a waveform diagram showing an example of signals in the CDR circuit 200 shown in FIG. 7.

Next, an example of an operation of the CDR circuit 200 configured as described above will be described. FIG. 8 is a waveform diagram showing an example of signals in the CDR circuit 200 shown in FIG. 7.

As shown in FIG. 8, when the received data signal "Din", which is a serial signal, is input to the CDR circuit 200, whether to invert the first clock signal "a1" or not is determined by the received data signal "Din" ("d0"). Then, the first clock signal "a1" no longer exhibits a periodic waveform.

Then, whether to invert the second clock signal "a2" or not is determined by the inverted signal of the first data signal "d1", and the second clock signal "a2" exhibits a periodic oscillation waveform again as shown in FIG. 8.

Supposing that the delaying cells in the CDR circuit 200 have the same signal delay time, the first clock signal "a1" is generated in synchronization with the first data signal "d1". Therefore, the second data signal "d2" and the second clock signal "a2" are in phase with each other.

In the second embodiment, the sixth clock signal "a6", which is obtained by shifting the fourth clock signal "a4" (oscillation clock signal "a0") output from the ring oscillator described above by a quarter of the period, is the recovery clock signal "RCK". And the fourth data signal "d4", which is obtained by shifting the second data signal "d2" by a quarter of the period, is the recovery data signal "Dout".

Therefore, the recovery clock signal "RCK" has a waveform that lags behind that of the recovery data signal "Dout" by a quarter of the period, and the center of the H/L data of the recovery data signal "Dout" can be properly sampled.

As described above, in the CDR circuit 200 according to the second embodiment, the recovery data signal "Dout" and the recovery clock signal "RCK" are in phase with each other, and the center of data can be properly sampled.

That is, the CDR circuit according to the second embodiment can control the recovery data signal and the recovery clock signal to be in a predetermined phase relationship.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A clock and data recovery (CDR) circuit comprising:
a first data delaying cell that receives a received data signal, delays the received data signal and outputs a resulting first data signal;
a second data delaying cell that receives the first data signal, delays the first data signal and outputs a resulting second data signal;
a first oscillation delaying cell that receives an oscillation clock signal, delays the oscillation clock signal and outputs a resulting first clock signal, the first oscillation delaying cell setting a logic of the first clock signal to be the same as a logic of the oscillation clock signal in a case where a logic of the received data signal is a first logic and setting the logic of the first clock signal to be an inversion of the logic of the oscillation clock signal in a case where the logic of the received data signal is a second logic, which is an inversion of the first logic;
a second oscillation delaying cell that receives the first clock signal, delays the first clock signal and outputs a resulting second clock signal, the second oscillation delaying cell setting a logic of the second clock signal to be the same as the logic of the first clock signal in a case where a logic of the first data signal is the second logic and setting the logic of the second clock signal to be an inversion of the logic of the first clock signal in a case where the logic of the first data signal is the first logic;
a third oscillation delaying cell that receives the second clock signal, delays the second clock signal and outputs a resulting third clock signal; and
a fourth oscillation delaying cell that receives the third clock signal, delays and inverts a logic of the third clock signal, and outputs a resulting fourth clock signal as the oscillation clock signal,
the second data signal is output at a data output terminal as a recovery data signal, and
the oscillation clock signal is output at a clock output terminal as a recovery clock signal.

2. The CDR circuit according to claim 1, comprising:
a third data delaying cell that receives the second data signal, delays the second data signal and outputs a resulting third data signal;
a fourth data delaying cell that receives the third data signal, delays the third data signal and outputs a resulting fourth data signal;
a fifth oscillation delaying cell that receives the fourth clock signal, delays the fourth clock signal and outputs a resulting fifth clock signal; and
a sixth oscillation delaying cell that receives the fifth clock signal, delays the fifth clock signal and outputs a resulting sixth clock signal,
wherein
the third oscillation delaying cell that receives the second clock signal, delays the second clock signal and outputs a resulting third clock signal, the third oscillation delaying cell setting a logic of the third clock signal to be the same as the logic of the second clock signal in a case where a logic of the second data signal is the first logic and setting the logic of the third clock signal to be an inversion of the logic of the second clock signal in a case where the logic of the second data signal is the second logic;
the fourth oscillation delaying cell that receives the third clock signal, delays and inverts a logic of the third clock signal, and outputs a resulting fourth clock signal, the fourth oscillation delaying cell setting a logic of the fourth clock signal to be an inversion of the logic of the third clock signal in a case where a logic of the third data signal is the second logic and setting the logic of the fourth clock signal to be the same as the logic of the third clock signal in a case where the logic of the third data signal is the first logic;
the fourth data signal is output at the data output terminal as the recovery data signal, and
the fourth clock signal is the oscillation clock signal, and the sixth clock signal is output at the clock output terminal as the recovery clock signal.

3. The CDR circuit according to claim 1, wherein the first and second data delaying cells and the first to fourth oscillation delaying cells have an equal signal delay time.

4. The CDR circuit according to claim 2, wherein the first to fourth data delaying cells and the first to sixth oscillation delaying cells have an equal signal delay time.

5. The CDR circuit according to claim 1, wherein the first and second data delaying cells and the first to fourth oscillation delaying cells are Gilbert cell circuits.

6. The CDR circuit according to claim 2, wherein the first to fourth data delaying cells and the first to sixth oscillation delaying cells are Gilbert cell circuits.

7. The CDR circuit according to claim 1, wherein the first oscillation delaying cell has:
a first pMOS transistor that is connected to a power supply at a source thereof and to a first output terminal at a drain thereof and receives a first voltage at a gate thereof;
a second pMOS transistor that is connected to the power supply at a source thereof and to a second output terminal at a drain thereof and receives the first voltage at a gate thereof;
a first nMOS transistor that is connected to the drain of the first pMOS transistor at a drain thereof and to a first input terminal at a gate thereof;
a second nMOS transistor that is connected to the drain of the second pMOS transistor at a drain thereof, to a source of the first nMOS transistor at a source thereof and to a second input terminal at a gate thereof;
a third nMOS transistor that is connected to the source of the first nMOS transistor at a drain thereof and to a third input terminal at a gate thereof;
a fourth nMOS transistor that is connected to a source of the third nMOS transistor at a drain thereof and to a ground at a gate thereof and receives a second voltage at a gate thereof;
a fifth nMOS transistor that is connected to the drain of the second pMOS transistor at a drain thereof and to the first input terminal at a gate thereof;
a sixth nMOS transistor that is connected to the drain of the first pMOS transistor at a drain thereof, to a source of the fifth nMOS transistor at a source thereof and to the second input terminal at a gate thereof; and
a seventh nMOS transistor that is connected to the source of the fifth nMOS transistor at a drain thereof and to a fourth input terminal at a gate thereof,
one of the oscillation clock signal and the received data signal is input to the first input terminal and the second input terminal as differential inputs,
the other of the oscillation clock signal and the received data signal is input to the third input terminal and the fourth input terminal as differential inputs, and
the first clock signal is output at the first output terminal and the second output terminal as differential outputs.

8. The CDR circuit according to claim 2, wherein the first oscillation delaying cell has:
   a first pMOS transistor that is connected to a power supply at a source thereof and to a first output terminal at a drain thereof and receives a first voltage at a gate thereof;
   a second pMOS transistor that is connected to the power supply at a source thereof and to a second output terminal at a drain thereof and receives the first voltage at a gate thereof;
   a first nMOS transistor that is connected to the drain of the first pMOS transistor at a drain thereof and to a first input terminal at a gate thereof;
   a second nMOS transistor that is connected to the drain of the second pMOS transistor at a drain thereof, to a source of the first nMOS transistor at a source thereof and to a second input terminal at a gate thereof;
   a third nMOS transistor that is connected to the source of the first nMOS transistor at a drain thereof and to a third input terminal at a gate thereof;
   a fourth nMOS transistor that is connected to a source of the third nMOS transistor at a drain thereof and to a ground at a gate thereof and receives a second voltage at a gate thereof;
   a fifth nMOS transistor that is connected to the drain of the second pMOS transistor at a drain thereof and to the first input terminal at a gate thereof;
   a sixth nMOS transistor that is connected to the drain of the first pMOS transistor at a drain thereof, to a source of the fifth nMOS transistor at a source thereof and to the second input terminal at a gate thereof; and
   a seventh nMOS transistor that is connected to the source of the fifth nMOS transistor at a drain thereof and to a fourth input terminal at a gate thereof,
   one of the oscillation clock signal and the received data signal is input to the first input terminal and the second input terminal as differential inputs,
   the other of the oscillation clock signal and the received data signal is input to the third input terminal and the fourth input terminal as differential inputs, and
   the first clock signal is output at the first output terminal and the second output terminal as differential outputs.

9. The CDR circuit according to claim 3, wherein the first oscillation delaying cell has:
   a first pMOS transistor that is connected to a power supply at a source thereof and to a first output terminal at a drain thereof and receives a first voltage at a gate thereof;
   a second pMOS transistor that is connected to the power supply at a source thereof and to a second output terminal at a drain thereof and receives the first voltage at a gate thereof;
   a first nMOS transistor that is connected to the drain of the first pMOS transistor at a drain thereof and to a first input terminal at a gate thereof;
   a second nMOS transistor that is connected to the drain of the second pMOS transistor at a drain thereof, to a source of the first nMOS transistor at a source thereof and to a second input terminal at a gate thereof;
   a third nMOS transistor that is connected to the source of the first nMOS transistor at a drain thereof and to a third input terminal at a gate thereof;
   a fourth nMOS transistor that is connected to a source of the third nMOS transistor at a drain thereof and to a ground at a gate thereof and receives a second voltage at a gate thereof;
   a fifth nMOS transistor that is connected to the drain of the second pMOS transistor at a drain thereof and to the first input terminal at a gate thereof;
   a sixth nMOS transistor that is connected to the drain of the first pMOS transistor at a drain thereof, to a source of the fifth nMOS transistor at a source thereof and to the second input terminal at a gate thereof; and
   a seventh nMOS transistor that is connected to the source of the fifth nMOS transistor at a drain thereof and to a fourth input terminal at a gate thereof,
   one of the oscillation clock signal and the received data signal is input to the first input terminal and the second input terminal as differential inputs,
   the other of the oscillation clock signal and the received data signal is input to the third input terminal and the fourth input terminal as differential inputs, and
   the first clock signal is output at the first output terminal and the second output terminal as differential outputs.

10. The CDR circuit according to claim 4, wherein the first oscillation delaying cell has:
   a first pMOS transistor that is connected to a power supply at a source thereof and to a first output terminal at a drain thereof and receives a first voltage at a gate thereof;
   a second pMOS transistor that is connected to the power supply at a source thereof and to a second output terminal at a drain thereof and receives the first voltage at a gate thereof;
   a first nMOS transistor that is connected to the drain of the first pMOS transistor at a drain thereof and to a first input terminal at a gate thereof;
   a second nMOS transistor that is connected to the drain of the second pMOS transistor at a drain thereof, to a source of the first nMOS transistor at a source thereof and to a second input terminal at a gate thereof;
   a third nMOS transistor that is connected to the source of the first nMOS transistor at a drain thereof and to a third input terminal at a gate thereof;
   a fourth nMOS transistor that is connected to a source of the third nMOS transistor at a drain thereof and to a ground at a gate thereof and receives a second voltage at a gate thereof;
   a fifth nMOS transistor that is connected to the drain of the second pMOS transistor at a drain thereof and to the first input terminal at a gate thereof;
   a sixth nMOS transistor that is connected to the drain of the first pMOS transistor at a drain thereof, to a source of the fifth nMOS transistor at a source thereof and to the second input terminal at a gate thereof; and
   a seventh nMOS transistor that is connected to the source of the fifth nMOS transistor at a drain thereof and to a fourth input terminal at a gate thereof,
   one of the oscillation clock signal and the received data signal is input to the first input terminal and the second input terminal as differential inputs,
   the other of the oscillation clock signal and the received data signal is input to the third input terminal and the fourth input terminal as differential inputs, and
   the first clock signal is output at the first output terminal and the second output terminal as differential outputs.

11. A serial communication interface apparatus, comprising:
   a transmitter having a clock generator that generates a clock signal, a parallel-to-serial converting circuit that converts a parallel signal into a serial signal in synchronization with the clock signal and a driver that outputs a serial data signal, which is obtained by converting the serial signal to a predetermined signal level prescribed in a communication standard;

a transmission line through which the serial data signal output from the driver is transmitted; and a receiver having a clock and data recovery (CDR) circuit that generates a recovery clock signal and a recovery data signal based on a received data signal, which is the serial data signal transmitted through the transmission line and received, and a serial-to-parallel converting circuit that demodulates the recovery data signal into the parallel signal using the recovery clock signal, wherein the CDR circuit comprises:

a first data delaying cell that receives the received data signal, delays the received data signal and outputs a resulting first data signal;

a second data delaying cell that receives the first data signal, delays the first data signal and outputs a resulting second data signal;

a first oscillation delaying cell that receives an oscillation clock signal, delays the oscillation clock signal and outputs a resulting first clock signal, the first oscillation delaying cell setting a logic of the first clock signal to be the same as a logic of the oscillation clock signal in a case where a logic of the received data signal is a first logic and setting the logic of the first clock signal to be an inversion of the logic of the oscillation clock signal in a case where the logic of the received data signal is a second logic, which is an inversion of the first logic;

a second oscillation delaying cell that receives the first clock signal, delays the first clock signal and outputs a resulting second clock signal, the second oscillation delaying cell setting a logic of the second clock signal to be the same as the logic of the first clock signal in a case where a logic of the first data signal is the second logic and setting the logic of the second clock signal to be an inversion of the logic of the first clock signal in a case where the logic of the first data signal is the first logic;

a third oscillation delaying cell that receives the second clock signal, delays the second clock signal and outputs a resulting third clock signal; and a fourth oscillation delaying cell that receives the third clock signal, delays and inverts a logic of the third clock signal, and outputs a resulting fourth clock signal as the oscillation clock signal, the second data signal is output at a data output terminal as the recovery data signal, and the oscillation clock signal is output at a clock output terminal as the recovery clock signal.

12. The serial communication interface apparatus according to claim 11, wherein the first and second data delaying cells and the first to fourth oscillation delaying cells have an equal signal delay time.

13. The serial communication interface apparatus according to claim 11, wherein the first and second data delaying cells and the first to fourth oscillation delaying cells are Gilbert cell circuits.

14. The serial communication interface apparatus according to claim 12, wherein the first and second data delaying cells and the first to fourth oscillation delaying cells are Gilbert cell circuits.

15. The serial communication interface apparatus according to claim 11, wherein the first oscillation delaying cell has:

a first pMOS transistor that is connected to a power supply at a source thereof and to a first output terminal at a drain thereof and receives a first voltage at a gate thereof;

a second pMOS transistor that is connected to the power supply at a source thereof and to a second output terminal at a drain thereof and receives the first voltage at a gate thereof;

a first nMOS transistor that is connected to the drain of the first pMOS transistor at a drain thereof and to a first input terminal at a gate thereof;

a second nMOS transistor that is connected to the drain of the second pMOS transistor at a drain thereof, to a source of the first nMOS transistor at a source thereof and to a second input terminal at a gate thereof;

a third nMOS transistor that is connected to the source of the first nMOS transistor at a drain thereof and to a third input terminal at a gate thereof;

a fourth nMOS transistor that is connected to a source of the third nMOS transistor at a drain thereof and to a ground at a gate thereof and receives a second voltage at a gate thereof;

a fifth nMOS transistor that is connected to the drain of the second pMOS transistor at a drain thereof and to the first input terminal at a gate thereof;

a sixth nMOS transistor that is connected to the drain of the first pMOS transistor at a drain thereof, to a source of the fifth nMOS transistor at a source thereof and to the second input terminal at a gate thereof; and a seventh nMOS transistor that is connected to the source of the fifth nMOS transistor at a drain thereof and to a fourth input terminal at a gate thereof, one of the oscillation clock signal and the received data signal is input to the first input terminal and the second input terminal as differential inputs, the other of the oscillation clock signal and the received data signal is input to the third input terminal and the fourth input terminal as differential inputs, and the first clock signal is output at the first output terminal and the second output terminal as differential outputs.

16. The serial communication interface apparatus according to claim 12, wherein the first oscillation delaying cell has:

a first pMOS transistor that is connected to a power supply at a source thereof and to a first output terminal at a drain thereof and receives a first voltage at a gate thereof;

a second pMOS transistor that is connected to the power supply at a source thereof and to a second output terminal at a drain thereof and receives the first voltage at a gate thereof;

a first nMOS transistor that is connected to the drain of the first pMOS transistor at a drain thereof and to a first input terminal at a gate thereof;

a second nMOS transistor that is connected to the drain of the second pMOS transistor at a drain thereof, to a source of the first nMOS transistor at a source thereof and to a second input terminal at a gate thereof;

a third nMOS transistor that is connected to the source of the first nMOS transistor at a drain thereof and to a third input terminal at a gate thereof;

a fourth nMOS transistor that is connected to a source of the third nMOS transistor at a drain thereof and to a ground at a gate thereof and receives a second voltage at a gate thereof;

a fifth nMOS transistor that is connected to the drain of the second pMOS transistor at a drain thereof and to the first input terminal at a gate thereof;

a sixth nMOS transistor that is connected to the drain of the first pMOS transistor at a drain thereof, to a source of the fifth nMOS transistor at a source thereof and to the second input terminal at a gate thereof; and a seventh nMOS transistor that is connected to the source of the fifth nMOS transistor at a drain thereof and to a fourth input terminal at a gate thereof, one of the oscillation clock signal and the received data signal is input to the first input terminal and the second input terminal as differential inputs, the other of the oscillation clock signal and the received data signal is input to the third input terminal and the fourth input terminal as differential inputs, and the first clock signal is output at the first output terminal and the second output terminal as differential outputs.

17. The serial communication interface apparatus according to claim 13, wherein the first oscillation delaying cell has:

a first pMOS transistor that is connected to a power supply at a source thereof and to a first output terminal at a drain thereof and receives a first voltage at a gate thereof;

a second pMOS transistor that is connected to the power supply at a source thereof and to a second output terminal at a drain thereof and receives the first voltage at a gate thereof;

a first nMOS transistor that is connected to the drain of the first pMOS transistor at a drain thereof and to a first input terminal at a gate thereof;

a second nMOS transistor that is connected to the drain of the second pMOS transistor at a drain thereof, to a source of the first nMOS transistor at a source thereof and to a second input terminal at a gate thereof;

a third nMOS transistor that is connected to the source of the first nMOS transistor at a drain thereof and to a third input terminal at a gate thereof;

a fourth nMOS transistor that is connected to a source of the third nMOS transistor at a drain thereof and to a ground at a gate thereof and receives a second voltage at a gate thereof;

a fifth nMOS transistor that is connected to the drain of the second pMOS transistor at a drain thereof and to the first input terminal at a gate thereof;

a sixth nMOS transistor that is connected to the drain of the first pMOS transistor at a drain thereof, to a source of the fifth nMOS transistor at a source thereof and to the second input terminal at a gate thereof; and a seventh nMOS transistor that is connected to the source of the fifth nMOS transistor at a drain thereof and to a fourth input terminal at a gate thereof, one of the oscillation clock signal and the received data signal is input to the first input terminal and the second input terminal as differential inputs, the other of the oscillation clock signal and the received data signal is input to the third input terminal and the fourth input terminal as differential inputs, and the first clock signal is output at the first output terminal and the second output terminal as differential outputs.

18. The serial communication interface apparatus according to claim 14, wherein the first oscillation delaying cell has:

a first pMOS transistor that is connected to a power supply at a source thereof and to a first output terminal at a drain thereof and receives a first voltage at a gate thereof;

a second pMOS transistor that is connected to the power supply at a source thereof and to a second output terminal at a drain thereof and receives the first voltage at a gate thereof;

a first nMOS transistor that is connected to the drain of the first pMOS transistor at a drain thereof and to a first input terminal at a gate thereof;

a second nMOS transistor that is connected to the drain of the second pMOS transistor at a drain thereof, to a source of the first nMOS transistor at a source thereof and to a second input terminal at a gate thereof;

a third nMOS transistor that is connected to the source of the first nMOS transistor at a drain thereof and to a third input terminal at a gate thereof;

a fourth nMOS transistor that is connected to a source of the third nMOS transistor at a drain thereof and to a ground at a gate thereof and receives a second voltage at a gate thereof;

a fifth nMOS transistor that is connected to the drain of the second pMOS transistor at a drain thereof and to the first input terminal at a gate thereof;

a sixth nMOS transistor that is connected to the drain of the first pMOS transistor at a drain thereof, to a source of the fifth nMOS transistor at a source thereof and to the second input terminal at a gate thereof; and a seventh nMOS transistor that is connected to the source of the fifth nMOS transistor at a drain thereof and to a fourth input terminal at a gate thereof, one of the oscillation clock signal and the received data signal is input to the first input terminal and the second input terminal as differential inputs, the other of the oscillation clock signal and the received data signal is input to the third input terminal and the fourth input terminal as differential inputs, and the first clock signal is output at the first output terminal and the second output terminal as differential outputs.

\* \* \* \* \*